(12) United States Patent
Berstis

(10) Patent No.: US 6,873,526 B2
(45) Date of Patent: Mar. 29, 2005

(54) QUIET "FAN"

(75) Inventor: Viktors Berstis, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 142 days.

(21) Appl. No.: 10/427,132

(22) Filed: Apr. 30, 2003

(65) Prior Publication Data

US 2004/0218358 A1 Nov. 4, 2004

(51) Int. Cl.[7] .................................................. H05H 7/20
(52) U.S. Cl. ..................... 361/694; 62/259.2; 165/80.3; 165/80.4; 165/121; 165/286; 174/15.1; 174/16.1; 361/698; 361/699; 361/695
(58) Field of Search .................... 62/259.2; 165/80.3, 165/80.4, 121–122, 185, 286; 174/15.1, 16.1; 361/687–688, 694–695, 698–699; 454/184

(56) References Cited

U.S. PATENT DOCUMENTS

| | | | | |
|---|---|---|---|---|
| 4,495,545 A | * | 1/1985 | Dufresne et al. | 361/695 |
| 5,793,610 A | * | 8/1998 | Schmitt et al. | 361/695 |
| 5,823,005 A | * | 10/1998 | Alexander et al. | 62/259.2 |
| 5,940,522 A | | 8/1999 | Cahill et al. | 381/397 |
| 6,180,203 B1 | * | 1/2001 | Unkles | 428/71 |
| 6,219,431 B1 | | 4/2001 | Proni | 381/397 |
| 6,330,153 B1 | * | 12/2001 | Ketonen et al. | 361/690 |
| 6,390,231 B1 | | 5/2002 | Howze | 181/148 |
| 6,405,794 B1 | * | 6/2002 | Kim et al. | 165/286 |

* cited by examiner

Primary Examiner—Gregory Thompson
(74) Attorney, Agent, or Firm—Duke W. Yee; David A. Mims, Jr.; Patrick C. R. Holmes

(57) ABSTRACT

A system and method for cooling by orchestrated movement of pistons to displace gases or fluids. The present invention uses a plurality of pistons which move in arranged patterns that force air through a channel in a single direction. The movement of air displaces heat, and the apparatus can be placed so as to provide cooling to devices in, for example, a computer system, by quietly moving air away from a heat source. The pistons are preferably moved at subsonic rates so they do not substantially contribute audible noise.

21 Claims, 3 Drawing Sheets

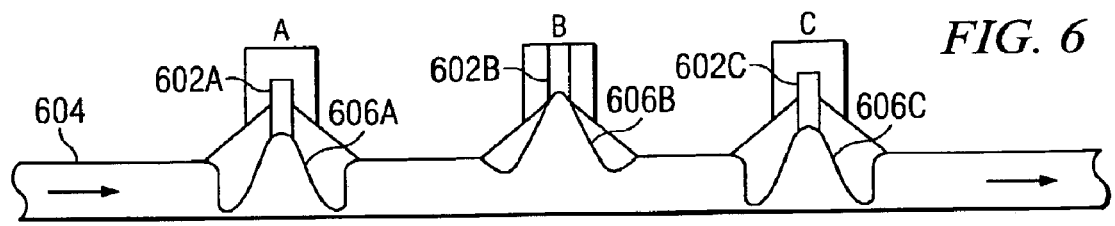
*FIG. 6*
*FIG. 7A*
*FIG. 7B*
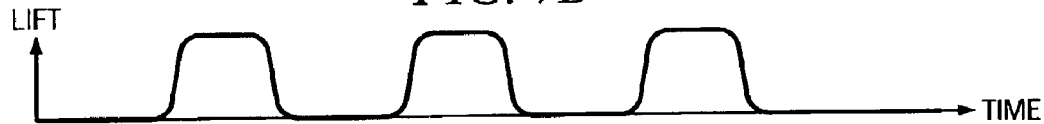
*FIG. 7C*
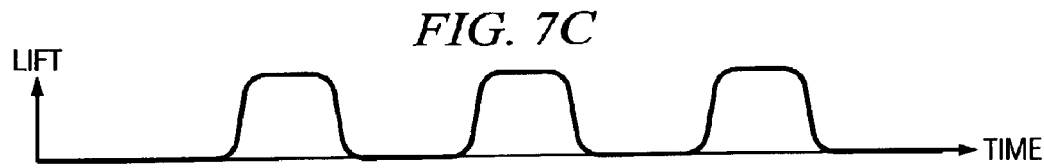
*FIG. 8*
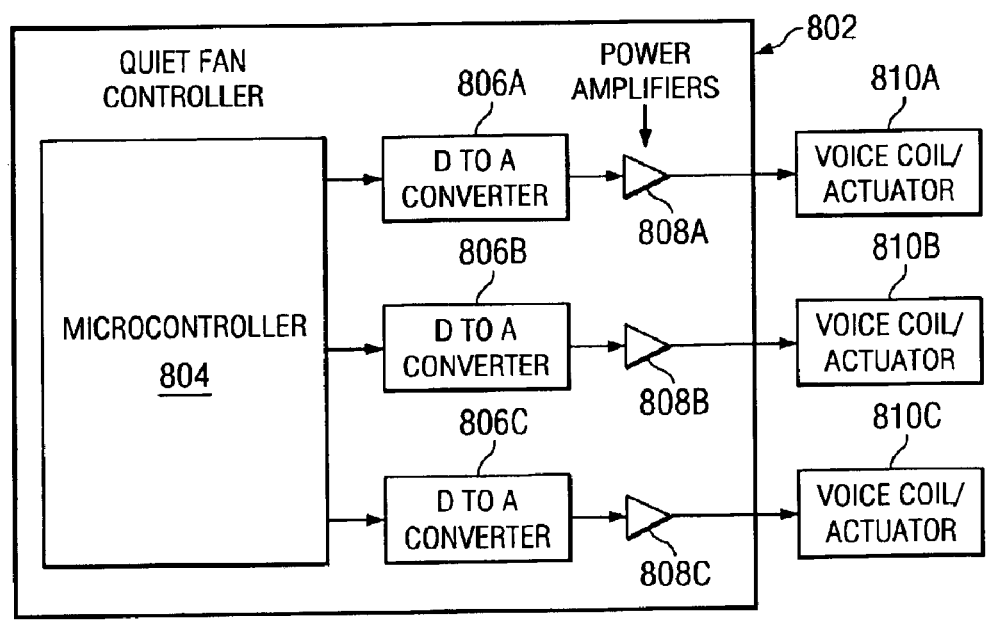

QUIET "FAN"

BACKGROUND OF THE INVENTION

1. Technical Field

The present invention is directed generally to a system and method for cooling, and particularly to noise reduction in a cooling apparatus.

2. Description of Related Art

Personal computers and laptop computers are often used in settings with low ambient noise, such as the home or an office. A computer's fan and disk noise can become irritating after a prolonged time. While fluid dynamic bearings have helped reduce noise of disk drives, cooling fans in most computers still produce substantial noise.

Cooling fans in computers generally operate at high RPMs, generating audio noise caused by the fan blades effectively pulsing the air and causing bursts of turbulence when passing near grill work and other structures that may e present. In addition, the bearings of the fans are typically quite noisy. Computers require such cooling apparatus because their components generate substantial amounts of heat, and this heat can degrade performance of integrated circuits and other parts.

Fans also occupy a fairly large volume in a computer case, which can displace other components in an environment with limited room.

SUMMARY OF THE INVENTION

The present invention is directed to an improved system and method for cooling that uses a channel and pistons. In a preferred embodiment, the channel is in communication with a heat source. Pistons are positioned to close passage within the channel. The pistons are sequentially operated so that air or fluid (whatever substance occupies the channel) is moved away from the heat source.

For example, one embodiment includes three pistons in the channel. When the first piston is open, the second and third pistons are closed. Next, the first piston closes as the second piston opens, forcing air or fluid to move from the volume beneath the first piston to the volume beneath the second piston. Next, the second piston is lowered and the third piston raised, forcing air from the second volume to a volume beneath the third piston. This process repeats in a preferred embodiment, moving heat away from the heat source.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

FIG. 6 shows a side view of the innovative system according to a preferred embodiment.

FIGS. 7A–7C shows a chart of the movement of the pistons versus time in a preferred embodiment.

FIG. 8 shows an integrated circuit with a controller for a preferred embodiment.

DETAILED DESCRIPTION OF THE PREFERRED EMBODIMENT

Figure 1:
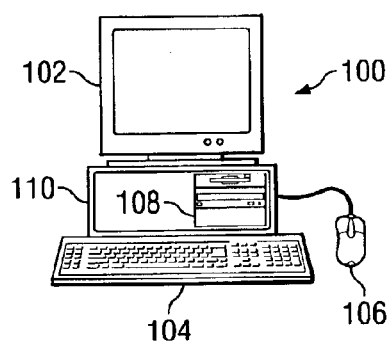
FIG. 1 shows a general computer system in which the present invention can be implemented.

With reference now to the figures and in particular with reference to FIG. 1, a pictorial representation of a data processing system in which the present invention may be implemented is depicted in accordance with a preferred embodiment of the present invention. Though the present invention is described herein as a cooling apparatus for use in cooling computer components, application of the presently disclosed ideas are not limited to cooling of computer systems. Other devices requiring movement of air or fluids can generally benefit from this disclosure, and the example of a computer system is not intended to limit the applicability of the present invention.

A computer 100 is depicted which includes a system unit 110, a video display terminal 102, a keyboard 104, storage devices 108, which may include floppy drives and other types of permanent and removable storage media, and mouse 106. Additional input devices may be included with personal computer 100, such as, for example, a joystick, touchpad, touch screen, trackball, microphone, and the like. Computer 100 can be implemented using any suitable computer, such as an IBM RS/6000 computer or IntelliStation computer, which are products of International Business Machines Corporation, located in Armonk, N.Y. Although the depicted representation shows a computer, other embodiments of the present invention may be implemented in other types of data processing systems, such as a network computer. Computer 100 also preferably includes a graphical user interface that may be implemented by means of systems software residing in computer readable media in operation within computer 100.

The present invention can be used in place of a typical cooling fan that would reside inside system unit 110.

Figure 2A:
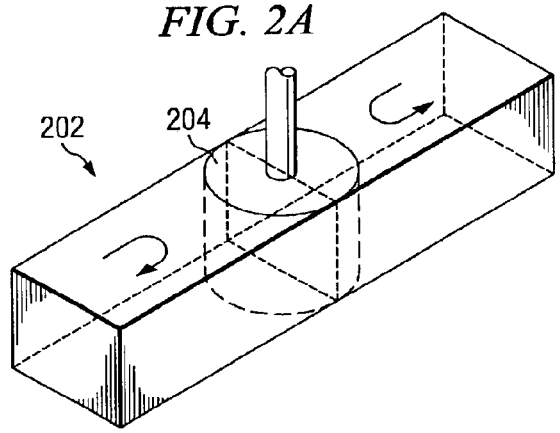
FIG. 2A shows a perspective of a piston blocking a channel.

FIG. 2A shows an example of a piston which serves as a valve for allowing or denying passage of air (or a liquid) through the channel. Channel 202 is shown as a rectangular passage which is blocked by the presence of piston 204 situated inside channel 202. In a preferred embodiment, the piston moves up and down according to a controller (not shown).

Figure 2B:
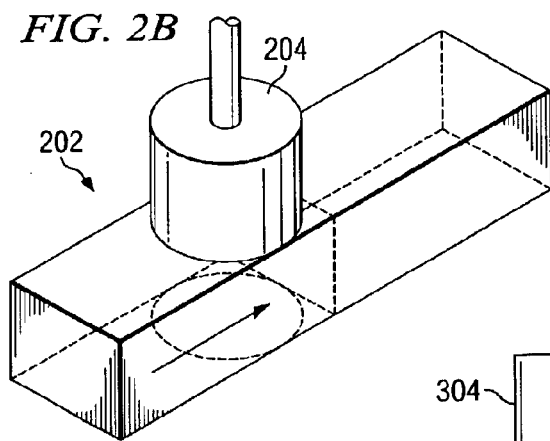
FIG. 2B shows a perspective of a piston vacating a channel to allow passage.

FIG. 2B shows the same system with the piston 204 in a raised position, allowing fluid or gas to pass through the channel 202. In a preferred embodiment, the pistons are controlled by a microcontroller. The use of pistons in this way produces less noise than a fan blade, which must operate at high rates of speed. The noise of the pistons is reduced further in preferred embodiments by lifting and lowering the pistons in a sinusoidal fashion, which reduces generation of noise from clicks or overtones from the primary motion. The pistons are moved in this fashion by using digital-to-analog (D/A) converted outputs from the microcontroller driving each piston.

In a preferred embodiment, the pistons are operated at subsonic rates (e.g., <20 Hz) so their motion does not substantially contribute to direct noise generation.

Note that though the present invention is described with reference to moving air through the channel, any kind of flowable matter, including any gas or liquid, can be moved by means of the present innovations.

In other preferred embodiments, the system is run at inaudible ultrasonic frequencies, e.g., grater than 20,00 Hz. In such an embodiment, the size of the pistons and the range of their movement is preferably limited to a size smaller than the wavelength of sound at those frequencies. By limiting this size, audible noise generated by the movement of the physical parts of the piston system is reduced. Micromechanical devices are preferably used to move air or fluids through channels, using pistons driven by piezoelectrically driven cantilevered arms, for example. In such an embodiment, the piston device is attached to one end of an arm while a piezoelectric device is attached to the other end. The arm is balanced on a fulcrum, so that as an electric field is applied to the piezoelectric material, causing its shape to change, the arm is moved about the fulcrum, causing corresponding movement of the piston end of the arm. Oscillating the electric field applied to the piezoelectric material causes oscillation of the piston, opening and closing it at the desired frequency.

FIGS. 3A–3D show one embodiment with three pistons and their relative positions at different times. In a preferred embodiment with three pistons, each piston is arranged such that it closes the channel while in a lowered or first position. While lifting, the volume under the piston increases and air is moved into this volume from a neighboring direction of the channel. When the piston is lowered again, air is again forced from beneath the piston. When multiple pistons are operated in the proper sequence, air is forced in one direction through the channel, as described below.

The following example process describes operation of the system with three pistons. Though preferred embodiments require three or more pistons, as few as two pistons can be implemented in the present invention.

Figure 3A:
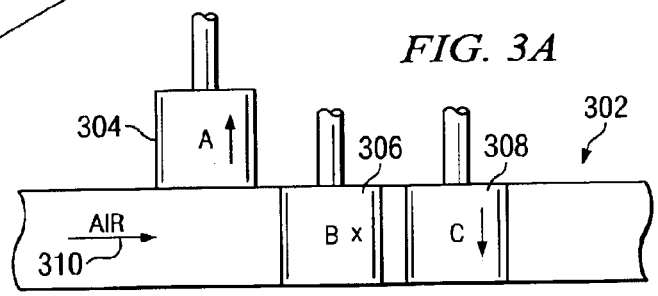
FIGS. 3A–3D show a three piston embodiment at different phases of operation.

FIG. 3A shows a first step to the process. Piston A 304 is raised, allowing air (or fluid) 310 to enter channel 302. At this step, air is only allowed into the space below piston A 304 because piston B 306 is in a lowered position, blocking channel 302. Piston C 308 is also lowered in this step.

Figure 3B:
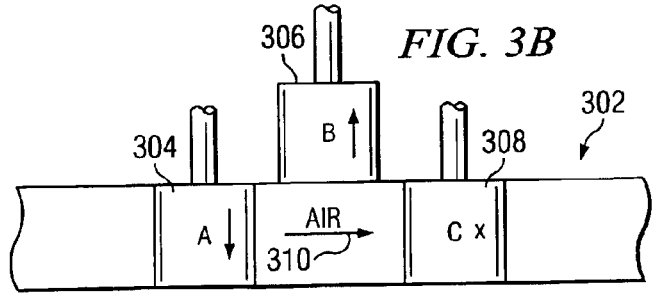

FIG. 3B shows a second stage in this innovative process. Piston A 304 is lowered, forcing air 310 from the volume beneath piston A 304. Piston B 306 is raised, allowing air 310 to move from beneath piston A 304 to the volume beneath piston B 306. Piston C 308 remains lowered, blocking passage of air 310.

Figure 3C:
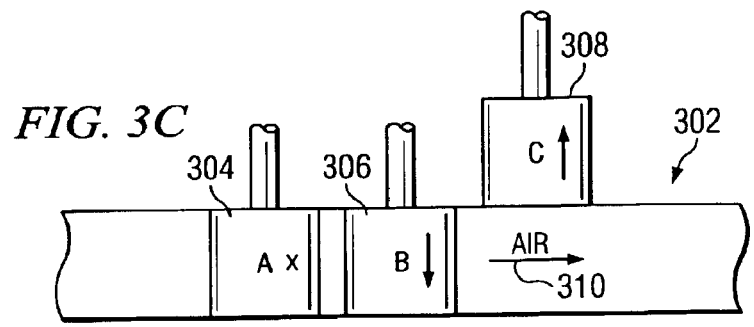

FIG. 3C shows a third state in the process. Piston A 304 remains lowered, while piston B 306 is also moved to a lowered position, forcing air 310 from beneath it. Piston C 308 is raised, allowing air 310 to move from beneath piston B 306 to the volume beneath piston C 308 and beyond. If there are only three pistons, this air is preferably moved outside the region to be cooled.

Figure 3D:
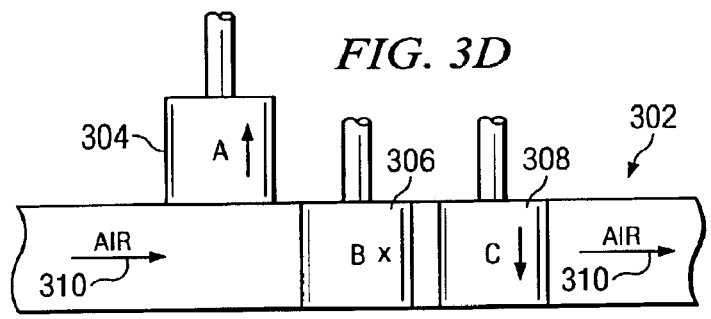

FIG. 3D shows a fourth state in the process. This state is identical to the first state shown in FIG. 3A. Piston A 304 is raised, while piston B 306 remains lowered and piston C 308 is lowered, forcing air to the right (in this example) through channel 302. More air 310 is entrained in the channel, and the process repeats. The net effect of this system is to move air or fluid through the channel 302 from left to right, away from a heat source, thus providing cooling.

The movement of the three pistons at each step is preferably simultaneous, though small delays or differentials can be implemented consistent with the present inventive concept.

Figure 4:
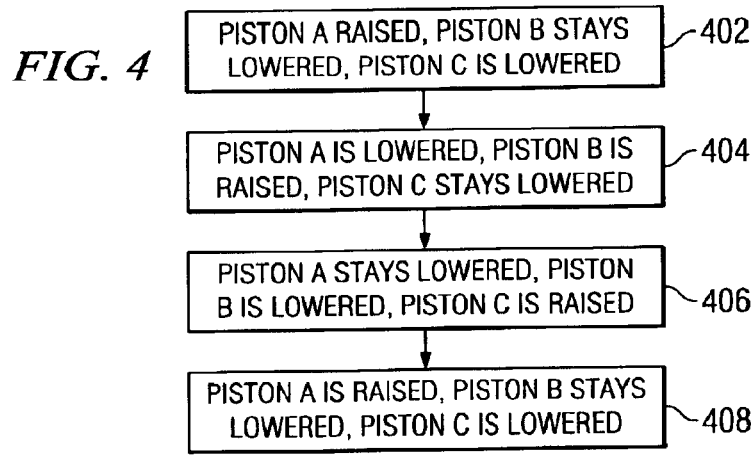
FIG. 4 is a flowchart describing one preferred implementation of the present invention.

FIG. 4 shows a process flow describing one embodiment of the present invention. As in FIG. 3, a three piston system is described. Three pistons, A, B, and C, are present in a channel, with the pistons arranged from left to right in this example.

Piston A is lifted allowing air to enter from the left, or outside the channel. No air comes from the right of piston A because piston B is closed. Piston C is lowered in this step, preferably simultaneously with piston A's movement (step 402).

Next, piston A is lowered as piston B is raised. A substantial amount of air moves from under piston A to the volume beneath piston B. Piston C is still closed (step 404).

Piston B is then lowered as piston C is raised. Piston A remains lowered. Almost all of the air beneath piston B is moved to the volume beneath piston C and out to the right (step 406).

Next, piston C is lowered forcing the air under it out to the right. Piston A is simultaneously lifted, while piston B remains lowered (step 408). Note that this step places the system in the same state as step 402, completing a cycle.

The net effect of the above described process is to move air from one end of the channel to the other. Some applications, such as an air pump in an aquarium, require greater air pressure. More pistons can of course be implemented in series to increase air flow rate or pressure, as needed. In a system with water, or other applications needing substantial pressure, at least three pistons are preferred so that one can act as a valve to prevent backflow.

Figure 5:
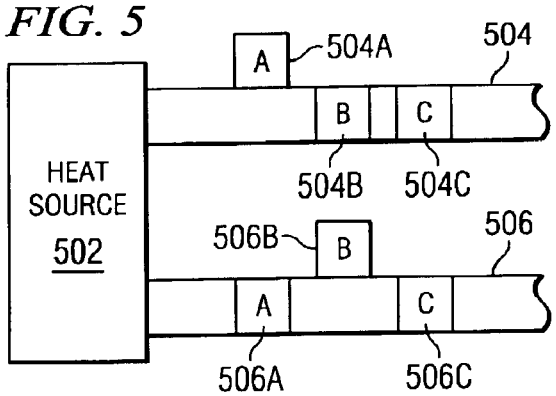
FIG. 5 shows an embodiment having parallel channels cooling the heat source.

In another embodiment, parallel channels are arranged to operate in different phases to smooth out the sum air movement, reducing pulsations of air movement that generate noise. FIG. 5 shows an example implementation. A heat source 502 is situated near channels 504, 506 which communicate air away from heat source 502. In channel 504 are pistons 504A, 504B, 504C. These pistons operate as described above, with the exception that they are specifically timed to be out of phase with the pistons 506A–C of parallel channel 506. In this depiction, while only piston 504A is raised in channel 504, only piston 506B is raised in channel 506. Hence, the movements of the two sets of pistons are out of phase with one another. The movements could also be made out of phase by a fraction of the piston movement period, e.g., while the pistons 504A–C are at the highest or lowest points in channel 504, the pistons 506A–C are in the process of moving, or are between their highest and lowest points in channel 506. By operating parallel channels out of phase with one another, the total air movement is averaged and pulses of air movement are thereby smoothed to some degree, further reducing noise of the system.

Another embodiment includes adding baffles to the backs of the pistons, so that their movement produces less air movement outside the channel.

FIG. 6 shows another view of the innovative system. In this embodiment, three pistons 602A, 602B, 602C are positioned above a channel 604. Pistons 602A, 602B, 602C are driven, in this example, the same way that audio speakers are drive. Pistons 602A, 602B, 602C are attached to diaphragms 606A, 606B, 606C. The pistons in such an implementation can comprise a magnetic material with current carrying coils surrounding them, so that when current is applied to the coil the piston raises due to the applied magnetic field. When, for example, piston 602B is raised as shown, diaphragm 606B also rises, allowing air to pass through the channel 604. The pistons and diaphragms are preferably designed so that they block the channel when in a resting position, so that current only need be applied when the pistons are to be raised.

FIGS. 7A–7C depicts the operation of a three piston embodiment, charting the lifting of each piston versus time. The top section of the graph (labeled A) represents the height of a first piston, the second section (labeled B) represents a second piston, and the bottom section (labeled C) represents a third piston.

As this chart shows, piston A rises, pulling air into the channel beneath it. Since piston B is down at this point, almost all the air comes from the left of piston A (assuming the relative positions of the pistons as shown in FIG. 6). Pistons B and C are down at this time. As time progresses, piston A lowers and piston B rises. This has the effect of forcing the air from beneath A to the channel region beneath B. As time progresses further, piston B lowers and piston C rises, forcing air from beneath piston B and into the region beneath piston C. Piston A is still lowered at the moment piston B lowers, so that air is forced toward piston C. At that time or slightly thereafter, piston A rises again, starting the cycle over.

FIG. 8 shows an integrated circuit 802 containing a microcontroller 804, three D to A converters 806A, 806B, 806C, and three driver amplifiers 808A, 808B, 808C, to lift voice coils 810A, 810B, 810C. In a preferred embodiment, the coils 810A, 810B, 810C only need raise the pistons (not shown), because the spring effect from the diaphragm (along with gravity in some orientations) has the effect of pulling the diaphragm back down. In a preferred embodiment, the microcontroller memory includes a table of values to use to gradually increase the current according to a sine function (for example) so as to minimize noise.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A cooling system, comprising:
   a heat source;
   a channel in communication with the heat source;
   a plurality of pistons positioned at the channel such that when a piston of the plurality is in a first position, the channel is blocked, and when a piston of the plurality is in a second position, the channel is not blocked.

2. The system of claim 1, wherein the plurality of pistons comprises three pistons; and wherein the three pistons are operated such that air is moved away from the heat source through the channel.

3. The system of claim 1, wherein the pistons of the plurality are oscillated between the first and second positions at an ultrasonic frequency, and wherein the pistons of the plurality are smaller in size than the wavelength of sound at the frequency at which the pistons are moved.

4. The system of claim 3, wherein the pistons of the plurality oscillate between the first and second positions in a sinusoidal fashion.

5. The system of claim 1, wherein the pistons of the plurality each include a baffle.

6. The system of claim 1, wherein when a piston of the plurality is in the first position, the channel is blocked by a diaphragm attached to the piston.

7. A method of removing heat from a heat source, comprising the steps of:
   connecting a channel with the heat source such that the channel is in communication with the heat source;
   opening and closing the channel at a plurality of locations by movement of a plurality of pistons;
   wherein the movement of the plurality of pistons conducts matter through the channel away from the heat source.

8. The method of claim 7, wherein each piston of the plurality of pistons includes a baffle.

9. The method of claim 7, wherein the plurality of pistons comprises three pistons.

10. The method of claim 7, wherein the steps of opening and closing the channel is accomplished by sinusoidal movement of the pistons.

11. The method of claim 7, wherein the matter comprises air.

12. The method of claim 7, wherein each piston of the plurality is driven by current in a coil.

13. A system for cooling a heat source, comprising:
   a channel connected to the heat source;
   first, second, and third pistons of the channel, each of the first, second, and third pistons being positioned to close or open the channel;
   wherein when the first piston is raised, air enters a first volume of the channel;
   wherein when the first piston is lowered and the second piston is raised, air moves from the first volume to a second volume; and
   wherein when the second piston is lowered and a third piston is raised, air moves from the second volume to a third volume.

14. The system of claim 13, wherein the first volume is a volume in the channel beneath the first piston; wherein the second volume is a volume in the channel beneath the second piston; and wherein the third volume is a volume of the channel beneath the third piston.

15. The system of claim 13, wherein the first, second, and third pistons each include a baffle.

16. The system of claim 13, wherein the first, second, and third pistons are moved in a sinusoidal fashion.

17. The system of claim 13, wherein the sequential opening and closing of the first, second, and third pistons moves heat away from the heat source.

18. A pumping system, comprising:
   a channel;
   a plurality of pistons positioned at the channel such that when a piston of the plurality is in a first position, the channel is blocked, and when a piston of the plurality is in a second position, the channel is not blocked;
   wherein movement of the pistons moves matter through the channel.

19. The system of claim 18, wherein the matter is air.

20. The system of claim 18, wherein the matter is a fluid.

21. The system of claim 18, wherein the plurality of pistons comprises three pistons; and wherein the three pistons are operated such that air is moved in one direction through the channel.

* * * * *